United States Patent
Lee

(12) 
(10) Patent No.: US 6,570,808 B2
(45) Date of Patent: May 27, 2003

(54) APPARATUS FOR SELECTING BANK IN SEMICONDUCTOR MEMORY DEVICE

(75) Inventor: Joo Sang Lee, Seoul (KR)

(73) Assignee: Hynix Semiconductor, Inc., Kyoungki-Do (KR)

(*) Notice: Subject to any disclaimer, the term of this patent is extended or adjusted under 35 U.S.C. 154(b) by 0 days.

(21) Appl. No.: 10/028,672

(22) Filed: Dec. 28, 2001

(65) Prior Publication Data

US 2002/0085443 A1 Jul. 4, 2002

(30) Foreign Application Priority Data

Dec. 30, 2000 (KR) ........................................ 2000/87292

(51) Int. Cl.$^7$ ............................................... G11C 7/00
(52) U.S. Cl. ........................... 365/230.02; 365/230.01; 365/230.04; 365/230.06; 365/225.7; 365/230.03
(58) Field of Search ..................... 365/230.01, 230.02, 365/230.03, 230.04, 230.06, 225.7

(56) References Cited

U.S. PATENT DOCUMENTS

| | | | | |
|---|---|---|---|---|
| 5,999,463 A | * | 12/1999 | Park et al. | ............ 365/200 |
| 6,067,268 A | * | 5/2000 | Lee | ............ 365/225.7 |
| 6,172,929 B1 | * | 1/2001 | Carson et al. | ............ 365/225.7 |
| 6,188,619 B1 | * | 2/2001 | Jung | |
| 6,310,805 B1 | * | 10/2001 | Kasa et al. | ............ 365/200 |
| 6,418,067 B1 | * | 7/2002 | Watanabe et al. | ............ 365/200 |

FOREIGN PATENT DOCUMENTS

JP        411162193 A   *  6/1999   ............ G11C/29/00

* cited by examiner

Primary Examiner—Viet Q. Nguyen
(74) Attorney, Agent, or Firm—Birch, Stewart, Kolasch & Birch, LLP

(57) ABSTRACT

An apparatus for selecting banks in a semiconductor memory device provides a half-chip by adjusting all bits including the most significant bit (MSB) of bank addresses to select normal banks even if degraded banks are included in both upper and lower bank blocks. In a memory including an upper bank block and a lower bank block which are constructed with a plurality of banks selectable by a plurality of bank addresses, an apparatus for selecting the banks includes a plurality of bank address control parts each corresponding to one address bit of the bank addresses, each of the bank address control part applying a fixed logic value to the upper and lower bank blocks according to a selective cutting of at least one of the fuses, and each of the bank address control parts applying either a corresponding bank address bit input thereto or a bank address bit just below the corresponding bank address bit to the upper and lower bank blocks.

16 Claims, 5 Drawing Sheets

FIG. 4

○ UNCUT FUSE
● CUT FUSE

| | | FA | FB | FC | FD | FE | FF | FG | FH | FI | FJ | FK | FL | FM | FN |
|---|---|---|---|---|---|---|---|---|---|---|---|---|---|---|---|
| 32 BANK | NORMAL | ○ | ○ | ○ | ○ | ○ | ○ | ○ | ○ | ○ | ○ | ○ | ○ | ○ | ○ |
| 16 BANK HAIF-CHIP | CASE 1 | ○ | ○ | ○ | ○ | ○ | ○ | ○ | ○ | ○ | ○ | ○ | ○ | ○ | ● |
| | CASE 2 | ○ | ○ | ○ | ○ | ○ | ○ | ○ | ○ | ○ | ○ | ○ | ○ | ● | ○ |
| | CASE 3 | ○ | ○ | ○ | ● | ○ | ○ | ○ | ○ | ○ | ○ | ○ | ● | ○ | ○ |
| | CASE 4 | ○ | ○ | ○ | ● | ○ | ○ | ○ | ○ | ○ | ○ | ● | ○ | ○ | ○ |
| | CASE 5 | ○ | ○ | ● | ● | ○ | ○ | ○ | ○ | ● | ○ | ○ | ○ | ○ | ○ |
| | CASE 6 | ○ | ○ | ● | ● | ○ | ○ | ○ | ● | ○ | ○ | ○ | ○ | ○ | ○ |
| | CASE 7 | ○ | ● | ● | ● | ○ | ○ | ○ | ● | ○ | ○ | ○ | ○ | ○ | ○ |
| | CASE 8 | ○ | ● | ● | ● | ○ | ○ | ● | ○ | ○ | ○ | ○ | ○ | ○ | ○ |
| | CASE 9 | ● | ● | ● | ● | ○ | ● | ○ | ○ | ○ | ○ | ○ | ○ | ○ | ○ |
| | CASE 10 | ● | ● | ● | ● | ● | ○ | ○ | ○ | ○ | ○ | ○ | ○ | ○ | ○ |

FIG. 5

○: SELECTED ×: UNSELECTED

| BANK NUMBER | CASE 1 | CASE 2 | CASE 3 | CASE 4 | CASE 5 | CASE 6 | CASE 7 | CASE 8 | CASE 9 | CASE 10 |
|---|---|---|---|---|---|---|---|---|---|---|
| 0 | ○ | × | ○ | × | ○ | × | ○ | × | ○ | × |
| 1 | ○ | × | ○ | × | ○ | × | ○ | ○ | × | ○ |
| 2 | ○ | × | ○ | × | ○ | × | × | ○ | ○ | × |
| 3 | ○ | × | ○ | × | ○ | × | ○ | ○ | × | ○ |
| 4 | ○ | × | ○ | × | × | ○ | ○ | × | ○ | × |
| 5 | ○ | × | ○ | × | × | ○ | ○ | × | ○ | ○ |
| 6 | ○ | × | ○ | ○ | × | ○ | × | ○ | × | × |
| 7 | ○ | × | × | ○ | ○ | × | ○ | × | ○ | ○ |
| 8 | ○ | × | × | ○ | ○ | × | ○ | × | × | × |
| 9 | ○ | × | × | ○ | ○ | × | × | ○ | ○ | ○ |
| 10 | ○ | × | × | ○ | × | ○ | × | × | × | × |
| 11 | ○ | × | × | ○ | × | ○ | ○ | ○ | ○ | ○ |
| 12 | ○ | × | × | ○ | × | ○ | × | × | × | × |
| 13 | ○ | × | × | ○ | × | ○ | ○ | ○ | ○ | ○ |
| 14 | ○ | × | ○ | × | ○ | × | ○ | × | × | × |
| 15 | ○ | ○ | ○ | × | ○ | × | ○ | ○ | ○ | ○ |
| 16 | × | ○ | ○ | × | ○ | × | × | × | × | × |
| 17 | × | ○ | ○ | × | ○ | × | ○ | ○ | ○ | ○ |
| 18 | × | ○ | ○ | × | ○ | × | × | × | × | × |
| 19 | × | ○ | ○ | × | ○ | ○ | ○ | ○ | ○ | ○ |
| 20 | × | ○ | ○ | × | × | ○ | × | × | × | × |
| 21 | × | ○ | ○ | × | × | ○ | ○ | ○ | ○ | ○ |
| 22 | × | ○ | × | ○ | ○ | × | × | × | ○ | ○ |
| 23 | × | ○ | × | ○ | ○ | × | ○ | ○ | × | × |
| 24 | × | ○ | × | ○ | ○ | × | × | × | ○ | ○ |
| 25 | × | ○ | × | ○ | × | ○ | ○ | ○ | × | × |
| 26 | × | ○ | × | ○ | × | ○ | ○ | × | ○ | ○ |
| 27 | × | ○ | × | ○ | × | ○ | ○ | ○ | × | × |
| 28 | × | ○ | × | ○ | × | ○ | × | × | ○ | ○ |
| 29 | × | ○ | × | ○ | × | ○ | ○ | ○ | × | × |
| 30 | × | ○ | ○ | ○ | × | ○ | × | ○ | ○ | ○ |
| 31 | × | ○ | × | ○ | × | ○ | × | ○ | × | ○ |

APPARATUS FOR SELECTING BANK IN SEMICONDUCTOR MEMORY DEVICE

RELATED APPLICATION

The present application claims the benefit of Korean Application No. 87292/2000 filed Dec. 30, 2000, under 35 U.S.C. §119, which is herein fully incorporated by reference.

BACKGROUND OF THE INVENTION

1. Field of the Invention

The present invention relates to a semiconductor memory device including a plurality of memory banks, and more particularly, to an apparatus and method for selecting banks in a semiconductor memory device to provide a half memory capacity product (hereinafter "half-chip") even when a failure occurs in a plurality of banks divided into upper and lower blocks.

2. Discussion of the Related Art

Memory banks ("banks") are sections of a memory device that store data and information. FIG. 1 shows an apparatus 30 for selecting banks in a semiconductor memory device according to a related art, in which the structure of a direct Rambus DRAM of 32 banks and 128M is shown in part.

Referring to FIG. 1, the bank selecting apparatus 30 is connected between a lower bank block 10 having first to sixteenth banks and an upper bank block 20 having seventeenth to thirty-second banks. The bank selecting apparatus 30 receives bank address bits BKADDR0 to BKADDR4 (together representing addresses) to select 32 banks. The appropriate bits BKADDR0 to BKADDR4 are input to the apparatus 30 from an external source or other internal source. If a logic value of the most upper bank address bit BKADDR4 input thereto is '0', then the bank selecting appartus 30 selects the lower bank block 10. If a logic value of the most upper bank address bit BKADDR4 is '1', then the bank selecting apparatus 30 selects the upper bank block 20.

The bank selecting apparatus 30 includes fuses F1 and F2, inverters I1 to I4, a NOR gate NR, PMOS and NMOS transistors P1 and N1 connected to each other in series, NMOS transistors N2 and N3 connected to each other in series between the lower and upper bank blocks 10 and 20, and PMOS and NMOS transistors P2 and N4 connected to each other in series. The fuse F1 is connected to the inverter I1, while the other fuse F2 is connected to the inverter I3. The outputs of the inverters I3 and I2 are applied to the gates of the PMOS and NMOS transistors P1 and N1, respectively, while the outputs of the inverters I1 and I4 are applied to the PMOS and NMOS transistors P2 and N4, respectively. An output of the NOR gate NR is input commonly to the gates of the NMOS transistors N2 and N3.

As shown, the selection circuit of the apparatus 30 is provided for only the MSB (most significant bit) BKADDR4 of bank addresses. No such circuit is provided for other bits BKADDR0~BKADDR3, so that these bits BKADDR0~BKADDR3 input to the apparatus 30 are automatically transmitted and applied to the lower and upper blocks 10 and 20 through lines L.

The operation of the bank selecting apparatus 30 in FIG. 1 is as follows.

If thirty-two banks arranged in the lower and upper bank blocks 10 and 20 are in a normal operational state, the fuses F1 and F2 will not be cut. In this case, the PMOS transistors P1 and P2 and NMOS transistors N1 and N4 are turned off and the NOR gate NR outputs a high level signal which turns on the NMOS transistors N2 and N3. As a result, all the bank address bits BKADDR0 to BKADDR4 input to the apparatus 30 are transmitted and applied to the lower and upper bank blocks 10 and 20, so as to select banks out of all 32 banks.

If the fuse F1 is cut by a failure of some banks in the upper bank block 20, the NOR gate NR outputs a low level signal and turns off the NMOS transistors N2 and N3. As a result, the bank address bit BKADDR4 input to the apparatus is not transmitted to the lower and upper bank blocks 10 and 20. However, the bank selecting apparatus 30 still allows the selection of the lower bank block 10 over the upper bank block 20 by the operation of the transistors P1, P2, N1 and N4. For instance, a high level signal is applied to the gates of the PMOS and NMOS transistors P1 and N1 so that a logic value '0' for the bit BKADDR4 is established and applied to the upper bank block 20. At the same time, a low level signal is applied to the gates of the PMOS and NMOS transistors P2 and N4 so that a logic value '1' for the bit BKADDR4 is established and applied to the lower bank block 10. That is, different logic values for the bit BKADDR4 are applied to the upper and lower bank blocks 20 and 10. In this matter, only the lower bank block 10 becomes available for selection.

Meanwhile, if the other fuse F2 is blown due to a failure of some banks in the lower bank block 10, in accordance with the above-mentioned operational procedures, a logic value '1' and a logic value '0' for the same address bit BKADDR4 are established by the transistors P1, P2, N1 and N4 and applied to the upper and lower bank blocks 20 and 10, respectively, whereby only the upper bank block 20 becomes available for selection.

If degraded banks are present in either the lower bank block 10 or the upper bank block 20, sixteen banks out of the thirty-two banks become available for use to provide a half-chip product, i.e., a 64M product which is a half-chip of a 128M product. If the banks 10 and 20 constitute a 1,144M product having 32 banks, then a 72M product having 16 banks will result in case of some failure in one of the blocks 10 and 20.

However, conventional bank selecting apparatus such as the apparatus 30 implements a half-chip product only when degraded banks are included in either the upper or lower bank block. Namely, conventional techniques do not allow a repair of a memory chip if degraded banks are included in both upper and lower bank blocks. If few blocks in both the upper and lower blocks fail, then the entire memory chip having 32 banks becomes useless. This reduces throughput of memory devices which increases costs associated with fabricating and operating chip products.

SUMMARY OF THE INVENTION

Accordingly, the present invention is directed to an apparatus and method for selecting banks in a semiconductor memory device that substantially obviates one or more problems due to limitations and disadvantages of the related art.

An object of the present invention is to provide an apparatus and method for selecting banks in a semiconductor memory device that increases throughput of the semiconductor memory device and reduces the product cost by realizing a half-chip.

Another object of the present invention is to provide an apparatus and method for selecting banks in a semiconductor memory device that realizes a half-chip even if degraded banks are included in both upper and lower bank blocks.

A further object of the present invention is to provide an apparatus and method for selecting banks in a semiconductor memory device that realizes a half-chip by adjusting all bits including the most significant bit (MSB) of bank addresses to select operational banks.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, in a semiconductor memory including an upper bank block and a lower bank block which are constructed with a plurality of banks selected by a plurality of bank addresses, respectively, an apparatus for selecting banks in a semiconductor memory includes a plurality of fuses cut selectively in accordance with locations of degraded banks included in the upper and lower bank blocks, a logic circuit producing control signals in accordance with the cutting of the fuses, and a plurality of multiplexers supplying the upper and lower bank blocks with bank addresses attained by combining a logic value of a fixed level, a corresponding bank address, and a shifted bank address so as to select normal banks in accordance with the control signals from the logic circuit.

In another aspect of the present invention, in a semiconductor memory including an upper bank block and a lower bank block which are constructed with a plurality of banks selected by a plurality of bank addresses, respectively, an apparatus for selecting banks in a semiconductor memory includes a plurality of bank address control parts corresponding to the respective bank addresses, each of the bank address control part applying a fixed logic value to the upper and lower bank blocks according to a cutting of a plurality of fuses, and each of the bank address control part applying either a corresponding bank address or a bank address just below the corresponding bank address to the upper and lower bank blocks selectively.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 4 illustrates a table showing different cases where fuses in FIG. 3 are cut; and FIG. 5 illustrates a table showing bank selections based on the table in FIG. 4.

DETAILED DESCRIPTION OF THE PREFERRED EMBODIMENTS

Reference will now be made in detail to the preferred embodiments of the present invention, examples of which are illustrated in the accompanying drawings.

Figure 1:
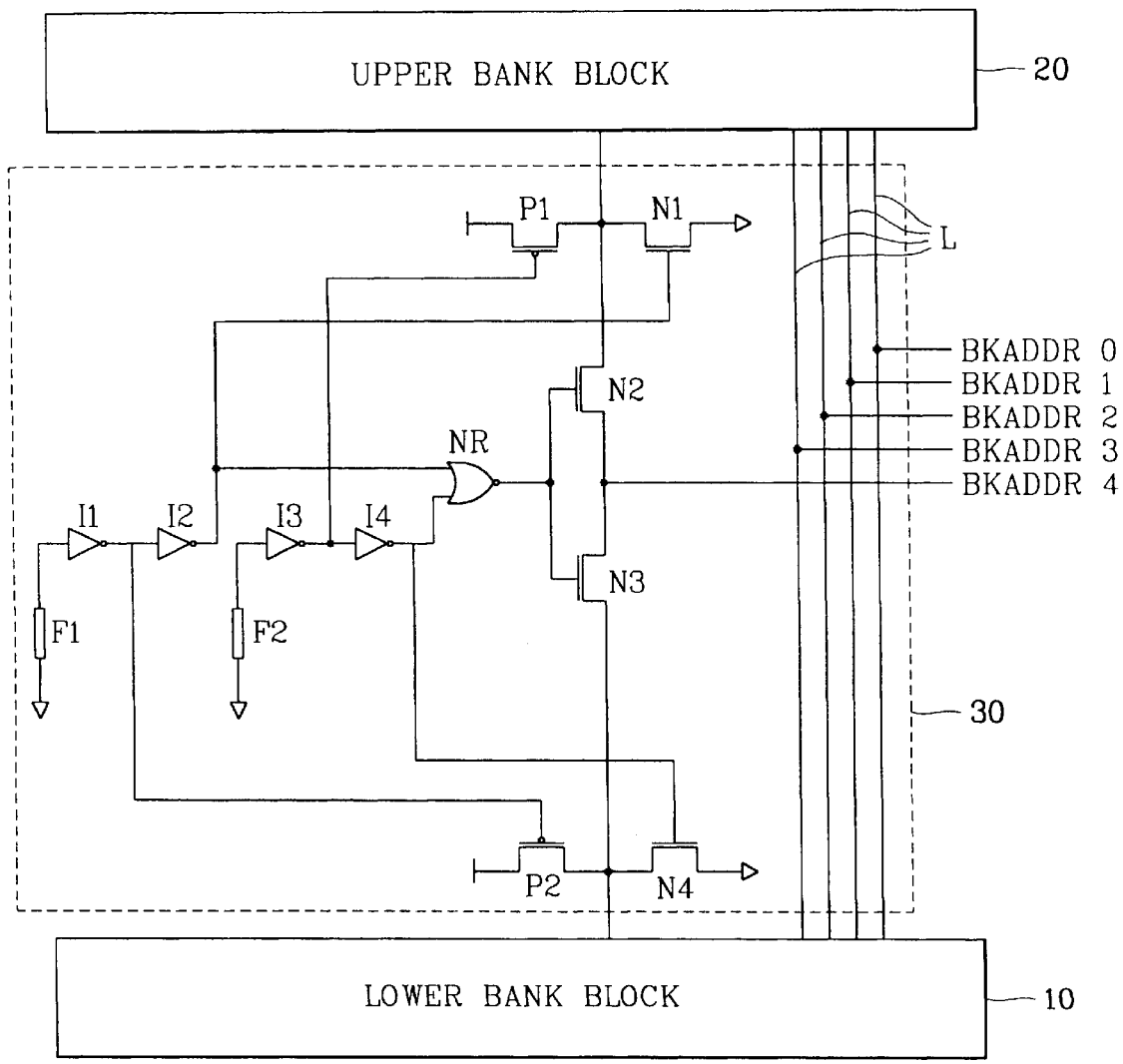
FIG. 1 illustrates a circuit diagram of a bank selecting apparatus for selecting banks in a semiconductor memory device according to a related art.
Figure 2:
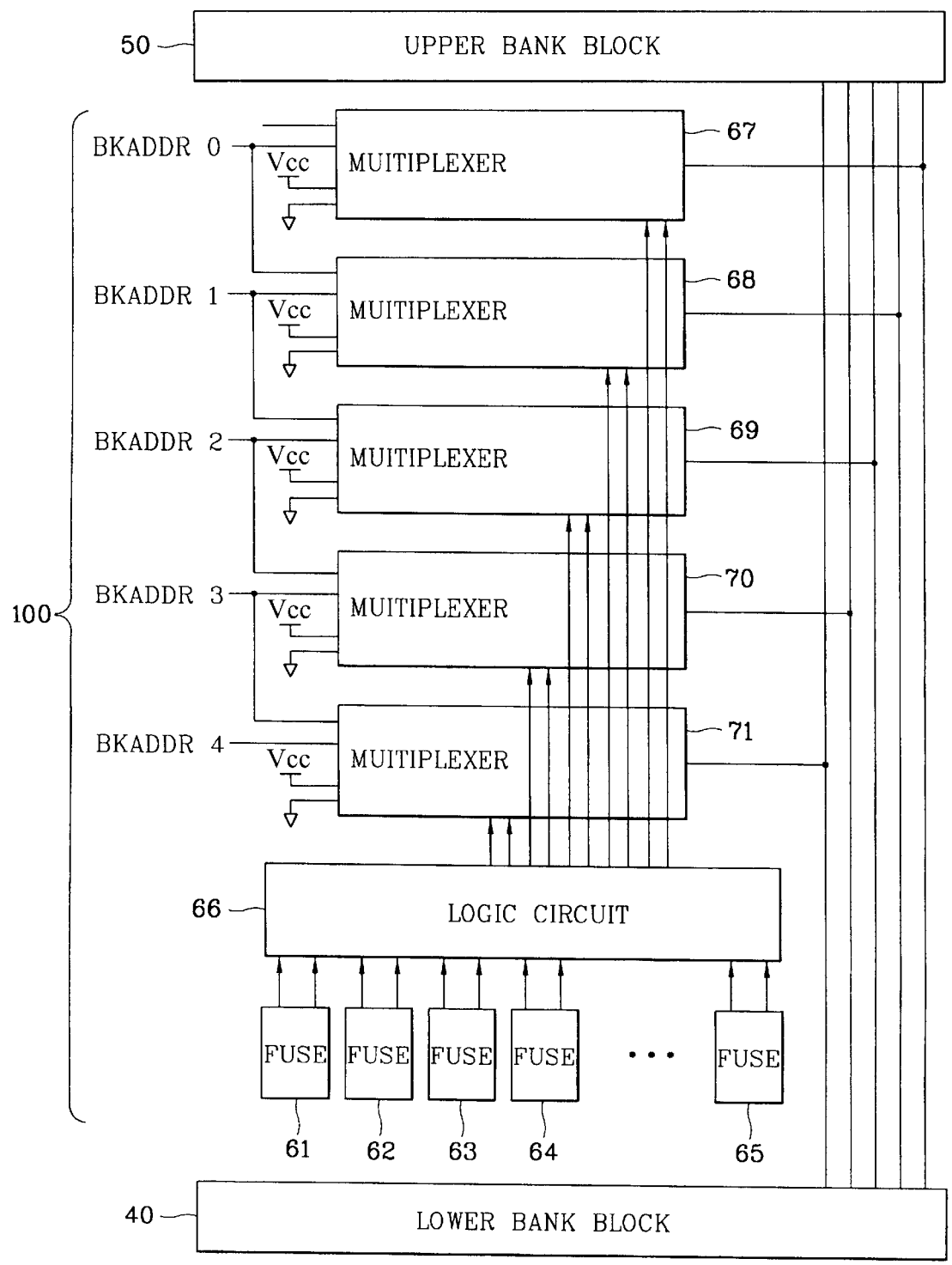
FIG. 2 illustrates a block diagram of an apparatus for selecting banks in a semiconductor memory device according to one embodiment of the present invention.

FIG. 2 illustrates a functional block diagram of an apparatus 100 for selecting banks in a semiconductor memory device according to one embodiment of the present invention.

Referring to FIG. 2, the apparatus 100 is constructed with a plurality of fuses 61 to 65 which are selectively cut in response to degraded or failed banks according to the location of such banks, a logic circuit 66 for producing control signals in accordance with the cut-off status of the fuses 61 to 65, and a plurality of multiplexers (switches/selectors) 67 to 71 for supplying an upper bank block 50 and a lower bank block 40 with logic values of fixed level corresponding to bank address bits BKADDR0 to BKADDR4 or shifted bank address bits, respectively, in accordance with the control signals from the logic circuit 66.

When degraded banks are included only in either the upper or lower bank block 50 or 40, a half-chip having, e.g., 16 banks is provided. In this case, one of the fuses 61 to 65 corresponding to the multiplexer 71 (bit BKADDR4) will be cut so as to cut off the supply of the most significant bank address bit BKADDR4 (input to the apparatus 100) to the bank blocks 40 and 50. When the fuse corresponding to a specific bank address bit I in the bank address bits BKADDR0 to BKADDR4 is cut, the supply or transmission of the bank address bit I to the blocks 40 and 50 is cut off, and the input bank address bit I to the bank address bit MSB−1 are shifted to the bank address bit I+1 to the bank address bit MSB (Most Significant Bit), respectively. That is, the input logic values of the address bits I to MSB−1 are shifted to be the logic values of the address bits I+1 and MSB, respecitvely. Then, the logic circuit 66 supplies the multiplexers 67 to 71 with control signals so that the multiplexers 67 to 71 can output to the upper and lower bank blocks 50 and 40 signals corresponding to the shifted bank address bits.

Figure 3:
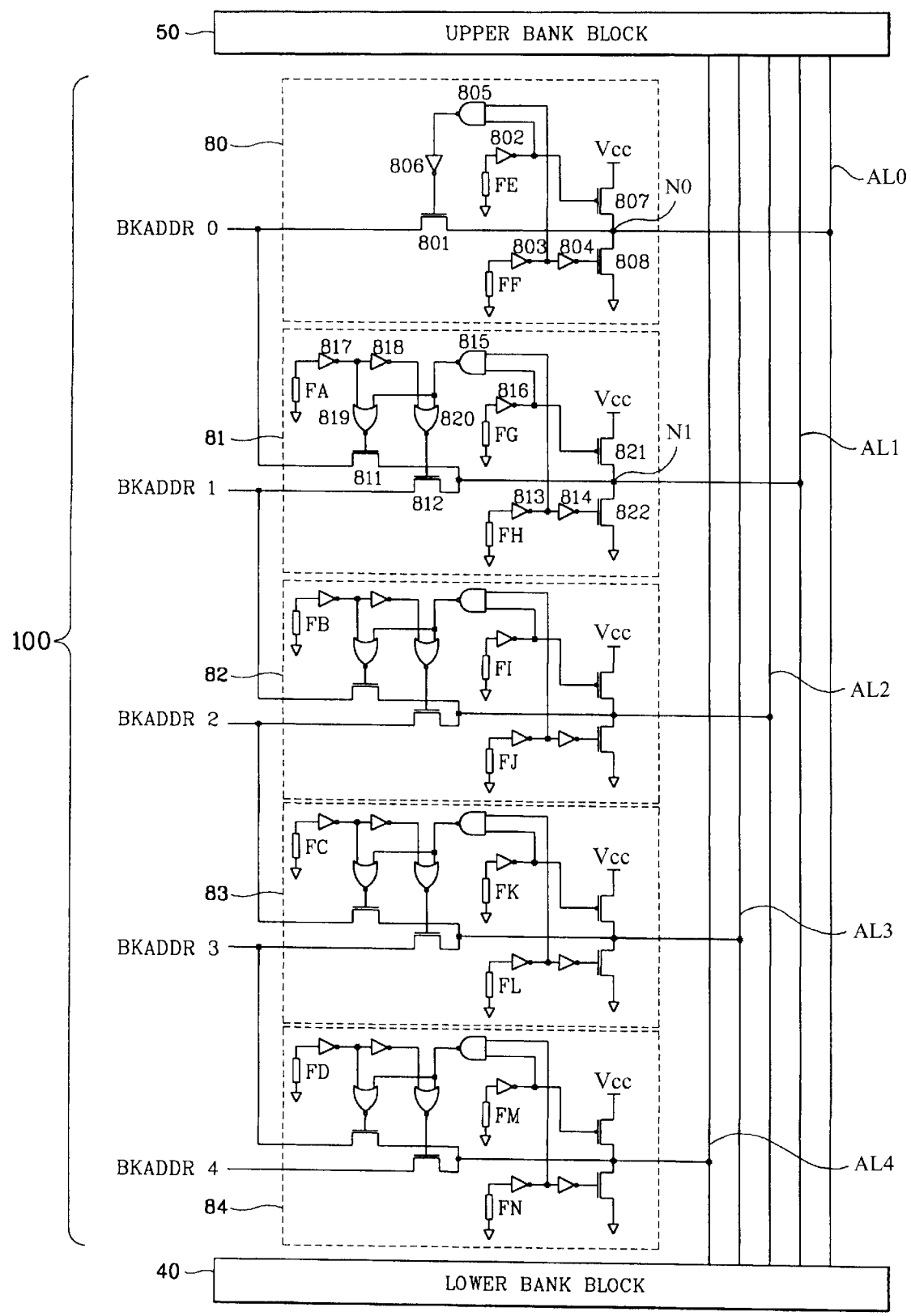
FIG. 3 illustrates a detailed circuit diagram of the apparatus shown in FIG. 2 according to one embodiment of the present invention.

FIG. 3 illustrates a detailed circuit diagram of the apparatus 100 in FIG. 2 according to one embodiment of the present invention.

Referring to FIG. 3, the apparatus 100 for selecting banks in a semiconductor memory device according to the present invention includes a plurality of bank address control parts 80 to 84 corresponding to the respective bank address bits BKADDR0 to BKADDR4, so as to apply fixed logic values of address bits BKADDR0 to BKADDR4 to the upper and lower bank blocks 50 and 40 in accordance with whether or not the fuses FA to FN are cut. One skilled in the art would readily appreciate that each of the bank address control parts 80–84 includes corresponding one(s) of the fuses 61–65 and performs functions of a corresponding one of the multiplexers 67–71 and the logic circuit 66.

Each of the upper and lower bank blocks 50 and 40 includes a plurality of banks selectable by the bank addresses represented by address bits BKADDR0 to BKADDR4.

As shown in FIG. 3, the bank address control part 80 corresponding to the lowest bank address bit BKADDR0 among the bank address bits BKADDR0 to BKADDR4 receives only the bank address BKADDR0.

The bank address control part 80 includes an NMOS transistor 801 for switching to apply the bank address bit BKADDR0 to the upper and lower bank blocks 50 and 40, fuses FE and FF of which one ends are grounded respectively, an inverter 802 of which one end is connected to the other end of the fuse FE, and a pair of inverters 803 and 804 which are connected to the other end of the fuse FF in series.

Further, the bank address control part 80 includes a NAND gate 805 for receiving outputs of the inverters 802 and 803, an inverter 806 for inverting an output of the NAND gate 805 and applying the inverted output to the gate of the NMOS transistor 801, a PMOS transistor 807 for pull-up and being driven by an output of the inverter 802, and an NMOS transistor 808 driven by an output of the inverter 804 and connected to the PMOS transistor 807 in series for pull-down. The transistors 807 and 808 are coupled between a voltage source Vcc and the ground. In this case, the bank address bit BKADDR0 passes via a common node N0 between the PMOS and NMOS transistors 807 and 808 so as to be connected to an address line AL0 of the upper and lower bank blocks 50 and 40 to form a transfer path of the bank address bit BKADDR0 of a bank address.

The bank address control part 81 includes NMOS transistors 811 and 812 switching to apply selectively one of the bank address bits BKADDR0 and BKADDR1 to the upper and lower bank blocks 50 and 40, fuses FA, FG, and FH of which one ends are grounded, an inverter 816 connected to the other end of the fuse FG, and inverters 813 and 814 connected to the other end of the fuse FH in series.

The bank address control part 81 also includes a NAND gate 815 for receiving outputs of the inverters 813 and 816, a pair of inverters 817 and 818 connected to the other end of the fuse FA in series, a NOR gate 819 for carrying out a NOR operation on the outputs of the inverter 817 and the NAND gate 815 and applying the NOR-operated output to the gate of the NMOS transistor 811, and another NOR gate 820 for carrying out a NOR operation on the outputs of the inverter 818 and the NAND gate 815 and applying the NOR-operated output to the gate of the NMOS transistor 812.

Further, the bank address control part 81 includes a PMOS transistor 821 driven by an output of the inverter 816 for pull-up, and an NMOS transistor 822 driven by an output of the inverter 814 and connected to the PMOS transistor 821 in series for pull-down. The transistors 821 and 822 are coupled between the voltage source Vcc and the ground. In this case, one of the bank address bits BKADDR0 and BKADDR1 input to the part 81 selectively passes via a common node N1 between the PMOS and NMOS transistors 821 and 822 so as to be applied to an address line AL1 of the upper and lower bank blocks 50 and 40 to form a transfer path of the bank addresses BKADDR0 and BKADR1.

The rest of the bank address control parts 82, 83, and 84 are constructed with the same elements of the bank address part 81 and function in the same manner. But they differ in that they respectively include fuses FB/FI/FJ, FC/FK/FL, and FD/FM/FN as well as receive the bank address bits BKADDR1/BKADDR2, BKADDR2/BKADDR3, and BKADDR3/BKADDR4, respectively. Thus, the bank address control parts 81~84 allow logic values of certain address bits to be shifted and be applied as next address bits. The address lines AL0–AL4 are designed to output address bits BKADDR0–BKADDR4 (values may be shifted values), respectively, to the blocks 50 and 40.

The above-constructed apparatus for selecting banks in a semiconductor memory according to an embodiment of the present invention operates as follows.

Referring to FIG. 3 to FIG. 5, when a memory chip of 32 banks includes at least 16 "normal" (operational) banks, as shown in the table of FIG. 4, a half-chip product is provided by cutting selectively one ore more of the fuses FA to FN in FIG. 3. As a result, 16 normal banks out of 32 banks can be selected in a manner as shown in FIG. 5 according to the present invention.

For instance, if the fuse FN included in the bank address control part 84 in FIG. 3 is cut (Case 1), the bank address bit BKADDR4 will not be applied to the upper and lower bank blocks 50 and 40. Instead, the upper and lower bank blocks 50 and 40 are supplied with a logic value '0' for the address bit BKADDR4 and, hence, as shown in FIG. 4 and FIG. 5, only bank 0 to bank 15 will be selectable.

The "Case 7" in which fuses FB, FC, FD and FH are cut is taken as an example and explained as follows.

In this case, the NMOS transistor 801 in the bank address control part 80 is turned on, while the PMOS and NMOS transistors 807 and 808 are turned off. Thus, the bank address bit BKADDR0 input thereto is normally applied to the upper and lower bank blocks 50 and 4G through the address lines AL0. For the bank address control part 81, the NMOS transistor 822 is turned on because the fuse FH is cut. The PMOS transistor 821 is turned off, the NAND gate 815 outputs a signal of high level, and the NOR gates 819 and 820 turn off the NMOS transistors 811 and 812, respectively. Therefore, the input bank address bits BKADDR0 and BKADDR1 are not applied to the upper and lower bank blocks 50 and 40. Instead, the upper and lower bank blocks 50 and 40 are supplied with a logic value '0' for the bit BKADDR1 position via the address line AL1.

For the bank address control part 82, as the fuse FB is cut, the NMOS transistor 825 switching the supply of the bank address BKADDR1 is turned on and the NMOS transistor 826 switching the supply of the bank address BKADDR2 is turned off. Hence, the upper and lower bank blocks 50 and 40 are supplied with the input bank address bit BKADDR1 value, instead of the input bank address bit BKADDR2 value for the bit BKADDR2 position via the address line AL2.

The upper and lower bank blocks 50 and 40 are supplied with the input bank address bits BKADDR2 and BKADDR3 for the BKADDR3 and BKADDR4 positions via the address lines AL3 and AL4 through the rest bank address control parts 83 and 84, respectively, in the same manner as the operation of the above-described bank address control part 82.

As discussed above, in the Case 7 in which the fuse FH connected to the pull-up PMOS or pull-down NMOS transistor is cut, the bank address control part 81 corresponding to the bank address bit BKADDR1 supplies the upper and lower bank blocks 50 and 40 with a logic value '0' of a fixed level by cutting off the input bank address bit BKADDR1. In this case, other bank address control parts 82, 83, and 84 select the input bank address bits BKADDR1, BKADDR2, and BKADDR3 instead of the input bank address bits BKADDR2, BKADDR3, and BKADDR4, respectively, and supply them as bank address bits BKADDR2 to BKADDR4 to the upper and lower bank blocks 50 and 40. The bank address part 80 corresponding to the bank address bit BKADDR0 which is lower than the bank address bit BKADDR1, supplies the upper and lower bank blocks 50 and 40 normally with the input bank address bit BKADDR0.

In this manner, as shown in FIG. 5, banks 0, 1, 4, 5, 8, 9, . . . , 28, and 29 are selectable since they correspond to the bank addresses supplied to the upper and lower bank blocks 50 and 40.

Thus, generally if a fuse, which is connected to a pull-up PMOS or pull-down NMOS transistor included in a bank address control part corresponding to a specific bank address bit I, is cut, then the supply of the corresponding bank address bit I is cut off, and the input bank address bit I value through the input bank address bit MSB−1 value are shifted to be the bank address bit I+1 value to the bank address bit MSB value, respectively, which are applied then to the upper and lower bank blocks 50 and 40 through bank address control parts.

As explained in the above description, in a multi-bank semiconductor memory device, the present invention provides a half-chip using a simple auxiliary circuit and fuses when certain banks are out of order, thereby increasing throughput of a device and reducing product costs.

Moreover, the present invention provides a half-chip by adjusting all the bits including the most significant bit (MSB) of bank addresses to select normal banks even if degraded banks are included in both upper and lower bank blocks. The present invention is not limited to processing 5 bit bank addresses, but is equally applicable to any numbered bit addresses.

The forgoing embodiments are merely exemplary and are not to be construed as limiting the present invention. The present teachings can be readily applied to other types of apparatuses or memories. The description of the present invention is intended to be illustrative, and not to limit the scope of the claims. Many alternatives, modifications, and variations will be apparent to those skilled in the art.

What is claimed is:

1. In a memory including an upper bank block and a lower bank block which are constructed with a plurality of banks selectable by a plurality of bank addresses, an apparatus for selecting the banks comprising:
   a plurality of fuses selectively cutable in accordance with locations of degraded banks included in the upper and lower bank blocks;
   a control circuit for producing control signals in accordance with the cutting of the fuses; and
   a plurality of multiplexers for supplying the upper and lower bank blocks with bank addresses corresponding to bits including at least one shifted input address bit in accordance with the control signals from the control circuit.

2. The apparatus of claim 1, wherein, when a degraded bank is included in either the upper or lower bank block, one of the multiplexers cuts off a supply of a most significant bank address bit in response to the control signals produced due to the cutting of a fuse corresponding to the most significant bank address bit.

3. The apparatus of claim 1, wherein the control circuit supplies the miltiplexers with the control signals so that, if a fuse corresponding to a specific input bank address bit I is cut, a supply of the input bank address bit I is cut off, and logic values of the input bank address bit I to input bank address bit MSB−1 are shifted to be logic values for bank address bit I+1 to bank address bit MSB, which are then applied to the upper and lower bank blocks.

4. The apparatus of claim 3, wherein, if the fuse corresponding to the specific input bank address I is cut, "0" logic values are applied for bank address bit 0 to I positions to the upper and lower bank blocks.

5. In a memory including an upper bank block and a lower bank block which are constructed with a plurality of banks selectable by a plurality of bank addresses, an apparatus for selecting the banks comprising:
   a plurality of bank address control parts, each of which corresponds to one address bit of the bank addresses, applies a fixed logic value to the upper and lower bank blocks according to a selective cutting of at least one of a plurality of fuses, and further applies either a corresponding bank address bit input thereto or a bank address bit just below the corresponding bank address bit to the upper and lower bank blocks.

6. The apparatus of claim 5, wherein each of the bank address control parts includes a pull-up PMOS and a pull-down NMOS.

7. The apparatus of claim 6, wherein, if a fuse connected to the pull-up PMOS or pull-down NMOS transistor of the bank address control part corresponding to a specific input bank address bit I is cut, a supply of the corresponding bank address bit I to the bank blocks is cut off.

8. The apparatus of claim 7, wherein logic values of the input bank address bit I to input bank address bit MSB−1 are shifted to be logic values for bank address bit I+1 to bank address bit MSB, which are then applied to the upper and lower bank blocks.

9. The apparatus of claim 7, wherein input bank address bits lower than the bank address bit I are applied to the upper and lower bank blocks through the corresponding bank address control parts.

10. The apparatus of claim 5, at least one of the bank address control parts comprising:
    a first NMOS transistor switching to apply a shifted lower bank address bit to the upper and lower bank blocks;
    a second NMOS transistor switching to apply a corresponding input bank address bit to the upper and lower bank blocks;
    first to third fuses having one ends grounded;
    a first inverter connected to another end of the second fuse;
    second and third inverters connected to another end of the third fuse in series;
    a NAND gate receiving outputs of the first and second inverters;
    fourth and fifth inverters connected to another end of the first fuse;
    a first NOR gate carrying out a NOR operation on outputs of the fourth inverter and NAND gate and applying the NOR-operated output to the first NMOS transistor;
    a second NOR gate carrying out NOR operation on outputs of the fifth inverter and NAND gate and applying the NOR-operated output to the second NMOS transistor;
    a PMOS transistor driven by an output of the first inverter; and
    a third NMOS transistor driven by an output of the third inverter and connected to the PMOS transistor in series.

11. The apparatus of claim 10, wherein a transfer path of the shifted lower bank address bit and the corresponding input bank address bit is connected to an address line of the upper and lower bank blocks via a common node between the PMOS and third NMOS transistors.

12. The apparatus of claim 5, wherein the bank address control part corresponding to the lowest bank address bit comprises:
    a first NMOS transistor switching to apply the lowest bank address bit to the upper and lower bank blocks;

first and second fuses having one ends grounded;

a first inverter having one end connected to another end of the first fuse;

second and third inverters connected to another end of the second fuse;

a NAND gate receiving outputs of the second and third inverters;

a forth inverter inverting an output of the NAND gate and applying the inverted output to the first NMOS transistor;

a PMOS transistor driven by an output of the first inverter; and a second NMOS transistor driven by an output of the third inverter and connected to the PMOS transistor in series.

13. The apparatus of claim 12, wherein a transfer path of the lowest bank address bit is connected to an address line of the upper and lower bank blocks via a common node between the PMOS and second NMOS transistors.

14. The apparatus of claim 5, wherein each of the bank address control parts includes a plurality of inverters, a plurality of transistors, and at least one logic gate.

15. The apparatus of claim 5, wherein each of the bank address control parts includes a multiplexer.

16. A method for selecting memory banks in accordance with selective cutting of at least one fuse, comprising the steps of:

receiving a predetermined number (N) of bank address bits;

shifting logic values of bank address bits I to MSB−1 to be logic values for bank address bits I+1 to MSB where MSB is a most significant bit in the N bank address bits, if a fuse corresponding to the bank address bit I is cut; and applying the shifted logic values to select appropriate memory banks.

* * * * *